(12) United States Patent
Yang et al.

(10) Patent No.: US 12,369,290 B2
(45) Date of Patent: Jul. 22, 2025

(54) MULTI-LAYER WAVE ABSORBER STRUCTURE AND USE THEREOF

(71) Applicant: Peking University, Beijing (CN)

(72) Inventors: Jinbo Yang, Beijing (CN); Zhou Liu, Beijing (CN); Wenyun Yang, Beijing (CN); Jingzhi Han, Beijing (CN); Changsheng Wang, Beijing (CN); Shunquan Liu, Beijing (CN)

(73) Assignee: Peking University, Beijing (CN)

( * ) Notice: Subject to any disclaimer, the term of this patent is extended or adjusted under 35 U.S.C. 154(b) by 396 days.

(21) Appl. No.: 17/893,230

(22) Filed: Aug. 23, 2022

(65) Prior Publication Data

US 2023/0056535 A1 Feb. 23, 2023

(30) Foreign Application Priority Data

Aug. 23, 2021 (CN) .......................... 202110966899.2

(51) Int. Cl.
*H05K 9/00* (2006.01)
*H01Q 17/00* (2006.01)

(52) U.S. Cl.
CPC .......... *H05K 9/0081* (2013.01); *H01Q 17/00* (2013.01); *H05K 9/0056* (2013.01)

(58) Field of Classification Search
CPC .. H05K 9/0081; H05K 9/0056; H05K 9/0088; H01Q 17/00
See application file for complete search history.

(56) References Cited

U.S. PATENT DOCUMENTS

| 5,381,149 A | * | 1/1995 | Dougherty | ............. | H01Q 17/00 |
| | | | | | 501/12 |
| 5,537,116 A | * | 7/1996 | Ishino | .................... | H01Q 17/00 |
| | | | | | 342/1 |

(Continued)

FOREIGN PATENT DOCUMENTS

| CN | 106025572 A | * 10/2016 | ............. H01Q 17/00 |
| CN | 107627678 A | 1/2018 | |
| CN | 112745694 A | * 5/2021 | ............... C08K 3/04 |

OTHER PUBLICATIONS

17893230_2025-02-06_CN_106025572_A_M.pdf, machine translation of CN-106025572-A (Year: 2016).*

(Continued)

*Primary Examiner* — William Kelleher
*Assistant Examiner* — Kenneth W Good
(74) *Attorney, Agent, or Firm* — Luedeka Neely, P.C.

(57) ABSTRACT

The present disclosure relates to the technical field of microwave absorption, and in particular, to a multi-layer wave absorber structure and use thereof. The multi-layer wave absorber structure has a sandwich structure, and an intermediate layer of the sandwich structure is an electromagnetic loss-free dielectric layer. The electromagnetic loss-free dielectric layer includes a vacuum layer, an air layer, a paraffin layer, or a polytetrafluoroethylene layer. The added electromagnetic loss-free dielectric layer enhances impedance matching by modulating phases of electromagnetic waves, such that loss of the electromagnetic waves in a composite wave absorbing layer of the multi-layer wave absorber structure is enhanced, and an effective absorption bandwidth is further improved. The multi-layer wave absorber structure provided by the present disclosure has higher universality and operability, and has an effect of improving an effective absorption bandwidth for wave (Continued)

absorbing devices made of various composite wave absorbing materials.

7 Claims, 8 Drawing Sheets

(56) References Cited

U.S. PATENT DOCUMENTS

| | | | | |
|---|---|---|---|---|
| 12,137,544 | B2* | 11/2024 | Mutou | B32B 15/095 |
| 2003/0215280 | A1* | 11/2003 | Hatasa | B41J 2/1752 |
| | | | | 401/132 |
| 2007/0062719 | A1* | 3/2007 | Shibata | C04B 35/565 |
| | | | | 427/117 |
| 2011/0133978 | A1* | 6/2011 | Sim | H01Q 17/007 |
| | | | | 427/102 |
| 2013/0009544 | A1* | 1/2013 | McCutcheon | H01B 3/004 |
| | | | | 445/24 |
| 2013/0224023 | A1* | 8/2013 | Kim | B32B 37/24 |
| | | | | 156/330 |
| 2018/0114760 | A1* | 4/2018 | Fu | H01L 23/49838 |
| 2018/0332742 | A1* | 11/2018 | Yamagata | B32B 27/28 |
| 2023/0392053 | A1* | 12/2023 | Tanaka | B32B 15/08 |
| 2024/0032268 | A1* | 1/2024 | Nakanishi | H05K 9/009 |
| 2024/0306356 | A1* | 9/2024 | He | B32B 27/18 |

OTHER PUBLICATIONS

17893230_2025-02-06_CN_112745694_A_M.pdf, machine translation of CN-112745694-A (Year: 2021).*

Longgang Yan, Jianbo Wang, Yunzhe Ye, Zhi Hao, Qingfang Liu, Fashen Li, "Broadband and Thin Microwave Absorber of Nickel-Zinc Ferrite/Carbonyl Iron Composite"—Journal of Alloys and Compounds 487 (2009) pp. 708-711—Elsevier B.V.

The State Intellectual Property Office of People's Republic of China, First Office Action in Chinese Application No. 202110966899.2, Mar. 14, 2022, 13 pp., China.

The State Intellectual Property Office of People's Republic of China, Second Office Action in Chinese Application No. 202110966899.2, May 13, 2022, 11 pp., China.

* cited by examiner

MULTI-LAYER WAVE ABSORBER STRUCTURE AND USE THEREOF

CROSS REFERENCE TO RELATED APPLICATION

This patent application claims the benefit and priority of Chinese Patent Application No. 202110966899.2, filed on Aug. 23, 2021, the disclosure of which is incorporated by reference herein in its entirety as part of the present application.

TECHNICAL FIELD

The present disclosure relates to the technical field of microwave absorption, and in particular, to a multi-layer wave absorber structure and use thereof.

BACKGROUND

With the continuous expansion and improvement of the application fields and frequency bands of electromagnetic waves in modern society, the development of new and efficient electromagnetic wave absorbing materials (abbreviated as wave absorbing materials) has become an increasingly urgent challenge for researchers for the purpose of radiation protection and energy absorption of electromagnetic waves. Relevant engineering materials, structural materials, and instrument accessories, or their surface materials urgently needed by electromagnetic pollution control and electromagnetic radiation protection in civil applications, stealth technology for radar signals in military applications, and electromagnetic shielding and protection for precision testing and confidential research and development in the field of scientific research have electromagnetic wave absorption properties, so as to ensure that personnel and instruments are not interfered and damaged, or to take the lead in military confrontation through electronic "stealth."

At present, the widely used magnetic wave absorbing materials are ferrite materials. For example, "Broadband and thin microwave absorber of nickel-zinc ferrite/carbonyl iron" (Journal of Alloys and Compounds 487(2009) 708-711) discloses a wave absorbing composite of ferrite and metal particles. However, the saturation magnetization of ferrite materials is low and is limited by the Snoek limit, and it is difficult to obtain higher resonance frequency and permeability. In order to overcome the defects of ferrite, facile rare earth-transition intermetallic compounds with high saturation magnetization and high Snoek limit have become a research hotspot, such as $Nd(Fe_{1-x}Co_x)_{10}V_2$, $Sm_2Fe_{14}B$, and $Ce_2Fe_{17}N_x$), wave absorbing materials, which have significant performance improvements over ferrite materials.

However, the effective absorption bandwidth of a single-layer uniform wave absorbing device composed of the above-mentioned wave absorbing materials is generally less than 6 GHz, and it is difficult to achieve an ultra-wide effective absorption bandwidth. In order to broaden the working frequency band of the wave absorbing device, complex structures have been designed to further improve the effective absorption bandwidth. The multi-layer wave absorbing structure of the sandwich structure has attracted extensive interest of researchers, for example, introducing carbon-based materials (such as carbon nanotubes, graphene, and carbon fibers) and metal materials (such as iron and cobalt meshes) as sandwich structures. These works have indeed improved the effective absorption bandwidth of the material to a certain extent, but the new interlayer introduced requires the selection of appropriate interlayer materials according to the needs of different wave absorber materials. The design of interlayers is not universal and the addition of interlayers usually result in a high overall mass of the wave absorber, which limits its practical application.

SUMMARY

In view of this, an objective of the present disclosure is to provide a multi-layer wave absorber structure and use thereof. An electromagnetic loss-free dielectric layer in the multi-layer wave absorber structure provided by the present disclosure is universal and can significantly improve an effective absorption bandwidth of a wave absorbing device without significantly increasing a total mass of the wave absorbing device.

To achieve the above objective of the present disclosure, the present disclosure provides the following technical solutions:

The present disclosure provides a multi-layer wave absorber structure, having a sandwich structure. An intermediate layer of the sandwich structure is an electromagnetic loss-free dielectric layer.

Preferably, the multi-layer wave absorber structure may include a metal backing and a first composite wave absorbing material layer, the electromagnetic loss-free dielectric layer, and a second composite wave absorbing material layer that are sequentially stacked on a surface of the metal backing.

Preferably, the electromagnetic loss-free dielectric layer may include a vacuum layer, an air layer, or an electromagnetic loss-free material layer, and the electromagnetic loss-free material layer may be made of one or more selected from the group consisting of paraffin, epoxy resin, and polytetrafluoroethylene.

Preferably, compositions of the first composite wave absorbing material layer and the second composite wave absorbing material layer may each include an electromagnetic wave absorbing agent and a binder.

Preferably, the electromagnetic wave absorbing agent may include one or more selected from the group consisting of graphene, carbonyl iron, ferrite, and rare earth-transition intermetallic compounds.

Preferably, the rare earth-transition intermetallic compounds may include $La_2Fe_4Co_{10}B$ and/or $Ce_{1.75}Sm_{0.25}Fe_{17}N_{3-\delta}$.

The present disclosure provides use of the multi-layer wave absorber structure according to the above technical solutions in microwave absorption.

The present disclosure provides the multi-layer wave absorber structure, provided with the sandwich structure. The intermediate layer of the sandwich structure is the electromagnetic loss-free dielectric layer. The added electromagnetic loss-free dielectric layer has no loss of electromagnetic waves, and enhances impedance matching by modulating phases of electromagnetic waves, such that loss of the electromagnetic waves in a composite wave absorbing layer of the multi-layer wave absorber structure is enhanced, and an effective absorption bandwidth is further improved. The multi-layer wave absorber structure provided by the present disclosure has higher universality and operability, and has an effect of significantly improving an effective absorption bandwidth for wave absorbing devices made of various composite wave absorbing materials. In addition, when the air or vacuum interlayer is selected, the effective absorption bandwidth can be obviously improved while a mass is hardly increased, such that the multi-layer wave absorber structure provided by the present disclosure has higher application value.

BRIEF DESCRIPTION OF THE DRAWINGS

FIGS. 4A and 4B show theoretical reflection loss curves and experimental test results of wave absorbers in Example 1, wherein

FIGS. 6A and 6B show theoretical reflection loss curves and experimental test results of wave absorbers in Example 3, wherein

FIGS. 7A and 7B show theoretical reflection loss curves of wave absorbers in Example 4, wherein

FIGS. 8A and 8B show theoretical reflection loss curves of wave absorbers in Example 5, wherein FIGS. 9A and 9B show theoretical reflection loss curves of wave absorbers in Example 6, wherein

DETAILED DESCRIPTION OF THE EMBODIMENTS

The present disclosure provides a multi-layer wave absorber structure, having a sandwich structure. An intermediate layer of the sandwich structure is an electromagnetic loss-free dielectric layer.

In the present disclosure, unless otherwise specified, all raw material components are commercially available products well known to those skilled in the art.

In the present disclosure, the electromagnetic loss-free dielectric layer preferably includes a vacuum layer, an air layer, or an electromagnetic loss-free material layer, and the electromagnetic loss-free material layer is made of one or more selected from the group consisting of paraffin, epoxy resin, and polytetrafluoroethylene. The present disclosure can improve the single-layer or multi-layer uniform wave absorbing device with a working range of frequency above 1 GHz and a metal backing by using the above-mentioned electromagnetic loss-free dielectric layer, so as to further improve the effective absorption bandwidth of the wave absorbing device without greatly increasing the thickness of the wave absorbing material and the wave absorbing device. The present disclosure has no special limitations on the thickness of the electromagnetic loss-free dielectric layer, which can be adjusted according to actual needs.

In the present disclosure, the multi-layer wave absorber structure preferably includes a metal backing and a first composite wave absorbing material layer, the electromagnetic loss-free dielectric layer, and a second composite wave absorbing material layer that are sequentially stacked on a surface of the metal backing.

The present disclosure has no special limitations on the material of the metal backing, and a metal backing well known to those skilled in the art can be used, such as iron, aluminum or alloy. The present disclosure has no special limitations on the type of the alloy, and an alloy for a wave absorber well known to those skilled in the art can be used.

In the present disclosure, compositions of the first composite wave absorbing material layer preferably includes an electromagnetic wave absorbing agent and a binder. The present disclosure has no special limitations on the type of the electromagnetic wave absorbing agent, and an electromagnetic wave absorbing agent well known to those skilled in the art can be used. In specific examples of the present disclosure, the electromagnetic wave absorbing agent preferably includes one or more selected from the group consisting of graphene, carbonyl iron, ferrite, and rare earth-transition intermetallic compounds. The rare earth-transition intermetallic compounds preferably include $La_2Fe_4Co_{10}B$ and/or $Ce_{1.75}Sm_{0.25}Fe_{17}N_{3-\delta}$. The binder preferably includes paraffin and/or epoxy resin. In the present disclosure, the electromagnetic wave absorbing agent and the binder have a mass ratio of preferably (0.1-10):1, more preferably (1-8): 1, and further preferably (4-5):1. In the present disclosure, the number of layers of the first composite wave absorbing material layer is preferably greater than or equal to 1. The present disclosure has no special limitations on the thickness of the first composite wave absorbing material layer, which can be adjusted according to actual needs, specifically, such as 0.1-10 mm, more preferably 0.5-2 mm, and further preferably 1-1.5 mm.

In the present disclosure, compositions of the second composite wave absorbing material layer preferably includes an electromagnetic wave absorber and a binder. The optional type of the electromagnetic wave absorbing agent, the optional type of the binder, the mass ratio of the electromagnetic wave absorbing agent and the binder, the number of layers of the second composite wave absorbing material layer, and the thickness of the second composite wave absorbing material layer are preferably the same as those of the aforementioned first composite wave absorbing material layer, and will not be repeated here.

The present disclosure has no special limitations on the thickness of the multi-layer wave absorber structure, which can be determined according to actual needs. In the examples of the present disclosure, the thickness of the multi-layer wave absorber structure is preferably less than or equal to 3 mm, more preferably 2-3 mm.

In the present disclosure, the multi-layer wave absorber structure is preferably obtained by the following methods: (1) Electromagnetic parameter information of an original wave absorbing device without an electromagnetic loss-free dielectric layer in different frequency ranges are tested using a vector network analyzer. According to the electromagnetic parameter information, a theoretical reflection loss curve of the original wave absorbing device at different thicknesses is calculated by a transmission line formula, and an effective absorption bandwidth is calculated according to the theoretical reflection loss curve to obtain structural parameters with the maximum effective absorption bandwidth. (2) The achievable maximum bandwidth and corresponding structural parameters of the multi-layer absorber structure formed by adding a loss-free dielectric interlayer through improvement of the present disclosure are obtained through program calculation. The structural parameters include the chemical composition and thickness of each layer of composite wave absorbing material. (3) The theoretical reflection loss curve of the original wave absorbing device is compared with the theoretical reflection loss curve of the wave absorbing device. When the maximum effective absorption bandwidth of the wave absorbing device is greater than the maximum effective absorption bandwidth of the original wave absorbing device, a wave absorbing device having the structural parameters obtained in step (2) is provided. A curve of reflection loss of the wave absorbing device as a function of microwave frequency is measured using the vector network analyzer, and the curve is compared with the calculated reflection loss curve of the wave absorbing device in step (2). The applicability of the electromagnetic loss-free dielectric layer adopted in the present disclosure is verified theoretically and experimentally.

The present disclosure uses the vector network analyzer to test the electromagnetic parameter information of the original wave absorbing device without an electromagnetic loss-free dielectric layer in different frequency ranges. According to the electromagnetic parameter information, the theoretical reflection loss curve of the original wave absorbing device at different thicknesses is calculated by the transmission line formula.

In the present disclosure, a preparation method of the composite wave absorbing material layer without an electromagnetic loss-free dielectric layer in the original wave absorbing device is preferably the same as that of the aforementioned first composite wave absorbing material layer, and will not be repeated here. In the present disclosure, the original wave absorbing device is obtained by controlling a total thickness of the multi-layer wave absorber structure, and adjusting a thickness of each layer and the type of material selected for each composite wave absorbing material layer. The adjustment amount of the thickness is preferably is 0.1 mm. In the present disclosure, the precision of the thickness of each layer is 0.1 mm.

In the present disclosure, the different frequency ranges preferably include 1-48 GHz. In a specific example of the present disclosure, the different frequencies are preferably 1-18 GHz. In the present disclosure, the electromagnetic parameter information is preferably a relationship between a complex permeability and a complex dielectric permittivity with frequency in a frequency band of 1-18 GHz. In the present disclosure, the effective absorption bandwidth refers to the width of the frequency interval satisfying the reflection loss less than or equal to −10 dB.

Figure 1:
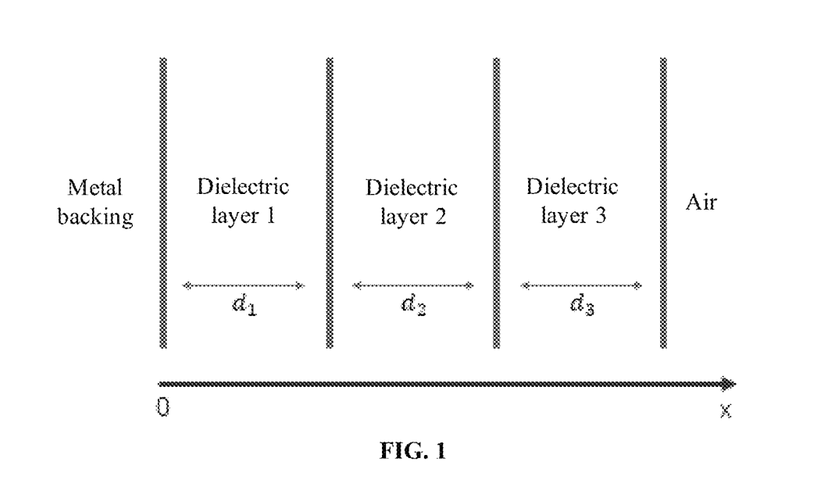
FIG. 1 is a schematic structural diagram of a three-layer wave absorbing device.
Figure 2:
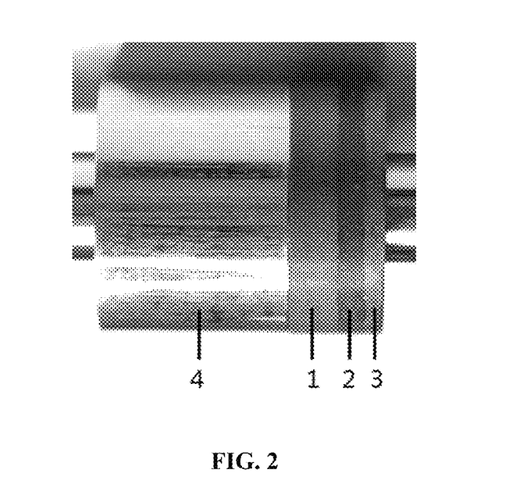
FIG. 2 is a physical diagram of the three-layer wave absorbing device, where 1 is a first composite wave absorbing material layer, 2 is an electromagnetic loss-free dielectric layer, 3 is a second composite wave absorbing material layer, and 4 is a metal backing.

In the present disclosure, the specific steps of obtaining the reflection loss curve are described by taking a three-layer wave absorbing device as an example. A schematic structural diagram of the three-layer wave absorbing device is shown in FIG. 1, and the three-layer wave absorbing device includes a metal backing, a first composite wave absorbing material layer (a dielectric layer 1), an electromagnetic loss-free dielectric layer (a dielectric layer 2), and a second composite wave absorbing material layer (a dielectric layer 3) that are sequentially stacked. A physical diagram of the three-layer wave absorbing device is shown in FIG. 2, where 1 is the first composite wave absorbing material layer, 2 is the electromagnetic loss-free dielectric layer, 3 is the second composite wave absorbing material layer, and 4 is the metal backing. In the present disclosure, it is preferable to use Structure=$[(M_1,d_1),(M_2,d_2),(M_3,d_3)]$ to represent the structure of the three-layer wave absorbing device, where $M_k$ represents the number of a composite wave absorbing material selected for a k-th layer, $d_k$ represents a thickness of the k-th layer, and k=1, 2, 3, . . . . According to Maxwell's equations and the boundary conditions at the junction of different layers, the electromagnetic parameter information is substituted to obtain a theoretical reflection loss curve of the three-layer wave absorbing device. An effective absorption bandwidth is calculated according to the theoretical reflection loss curve to obtain structural parameters with the maximum effective absorption bandwidth. The specific steps are as follows.

A general solution form of electromagnetic waves in the dielectric can be obtained by solving the Maxwell's equations:

the electric field distribution in the dielectric layer n is $$E(x)=A_n e^{ik_n(x-x_n)}+B_n e^{-ik_n(x-x_n)}, \text{ and}$$

the corresponding magnetic field distribution is $$H(x) = \frac{A_n}{\eta_n} e^{ik_n(x-x_n)} - \frac{B_n}{\eta_n} e^{-ik_n(x-x_n)},$$

where $k_n$ is a wave vector of the dielectric layer n, $$k_n = \frac{2\pi f}{c}\sqrt{\mu_n \varepsilon_n},$$

$\mu_n$ is a permeability of the dielectric layer n, $\varepsilon_n$ is a dielectric permittivity of the dielectric layer n, f is a frequency of electromagnetic waves, and c is a speed of light in vacuum; $A_n$ and $B_n$ are coefficients to be solved; $\eta_n$ is a wave impedance of the dielectric layer n, and $\eta_n=\sqrt{\mu_n/\varepsilon_n}$ and $x_n=\Sigma_{t=1}^{n-1}d_t$.

To facilitate the solution, variables $\Gamma_n=A_n/B_n$ and $Z_n=(1+\Gamma_n)/(1-\Gamma_n)$ are introduced, then $\Gamma_n=(Z_n-1)/(Z_n+1)$.

Considering the continuity of the electromagnetic field at the junction of the dielectric, the following can be obtained:

at the interface between the metal backing and the dielectric layer 1, according to the electric field in the ideal conductor of 0, $0=A_1+B_1$.

It can be known that $\Gamma_1=-1$, and $Z_1=0$.

Then considering the junction of the dielectric n and dielectric n+1:

according to the electric field continuity, $A_n e^{ik_n d_n}+B_n e^{-k_n d_n}=A_{n+1}$; and according to the magnetic field continuity, $$\frac{A_n}{\eta_n}e^{ik_n d_n}-\frac{B_n}{\eta_n}e^{-ik_n d_n}=\frac{A_{n+1}}{\eta_{n+1}}-\frac{B_{n+1}}{\eta_{n+1}}.$$

Then they are substituted into $\Gamma_n=A_n/B_n$, $\Gamma_{n+1}=A_{n+1}/B_{n+1}$, $Z_n=(1+\Gamma_n)/(1-\Gamma_n)$, and $Z_{n+1}=(1+\Gamma_{n+1})/(1-\Gamma_{n+1})$.

Therefore, it can be obtained that $$Z_{n+1}=\frac{\eta_n}{\eta_{n+1}}*\frac{Z_n+\tanh(ik_n d_n)}{Z_n\tanh(ik_n d_n)+1}.$$

Figure 3:
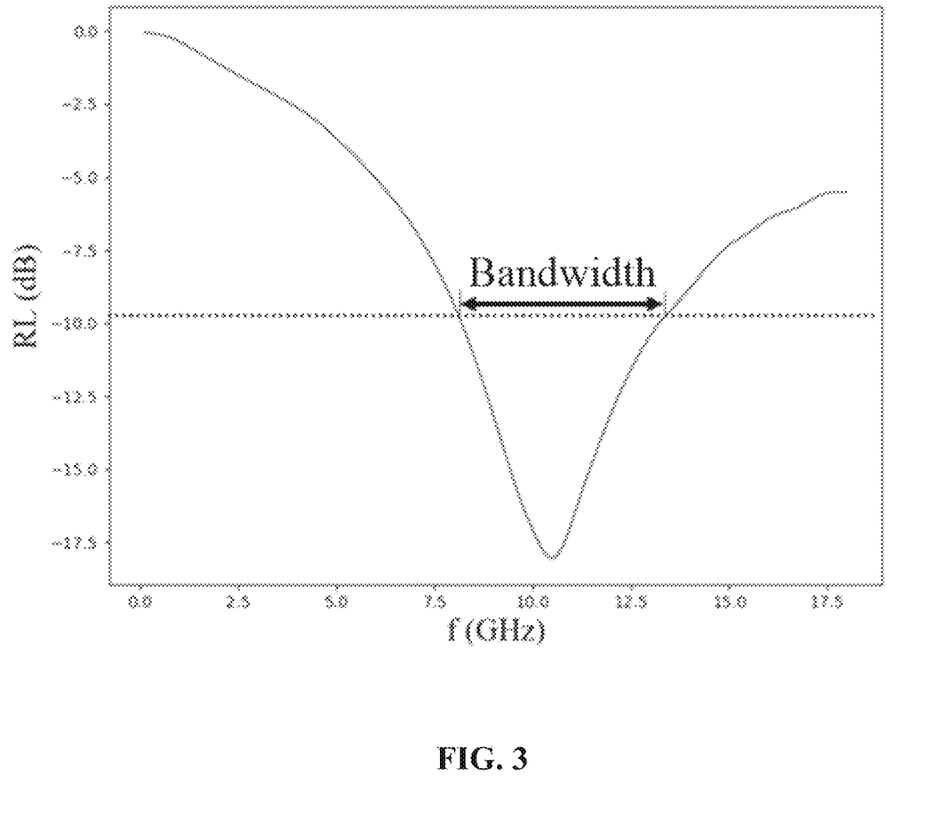
FIG. 3 is a schematic diagram of a reflection loss curve and an effective absorption bandwidth of a wave absorber.

It is known that $Z_1=0$ and the recursive relationship is known, whereby Z at the interface between the last layer of dielectric and air can be obtained. Thus, the reflection loss curve $$RL=20\log_{10}\left|\frac{Z-1}{Z+1}\right|$$

can be calculated to obtain the effective absorption bandwidth (the width of the frequency interval where RL is less than −10 dB, as shown in FIG. 3).

In the present disclosure, when the number of layers of the multi-layer wave absorber structure is greater than 3 (that is, a total number of layers of the first composite wave absorbing material layer+the electromagnetic loss-free dielectric layer+the second composite wave absorbing material layer is greater than 3), a method for calculating the theoretical reflection loss curve, and obtaining the effective absorption bandwidth according to the reflection loss curve, so as to obtain structural parameters with the maximum effective absorption bandwidth is the same as the principle of the aforementioned absorbing device with a 3-layer structure, and the specific steps are as follows. Structure=[(Material 1, Thickness 1), . . . ,(Material k, Thickness k)] is used to represent the structure of the wave absorbing device, where Material k represents the type of dielectric selected for a k-th layer (that is, the type of composite wave absorbing material or the material of the electromagnetic loss-free dielectric layer), and Thickness k represents a thickness of the layer. According to Maxwell's equations and the boundary conditions at the junction of different layers, the electromagnetic parameter information is substituted to obtain the theoretical reflection loss curve and the corresponding effective absorption bandwidth (Bandwidth) of the wave absorbing device corresponding to each Structure. The optimal Structure value corresponding to the maximum value of the Bandwidth (Structure) function can be obtained by computer calculation. The wave absorbing device added with the electromagnetic loss-free dielectric layer is prepared according to the obtained optimal Structure, and the theoretical calculation and experimental test of the maximum effective absorption bandwidth are carried out. The effective absorption bandwidth of the wave absorbing device can be greatly improved compared with that of the original wave absorbing device.

The present disclosure provides use of the multi-layer wave absorber structure according to the above technical solutions or the wave absorbing device according to the above technical solutions in the field of microwave absorption. In the present disclosure, a layer of interlayer without electromagnetic loss capability is added in the wave absorbing device, such that the impedance matching of the wave absorbing device is improved by only regulating the phase of the wave without changing its amplitude, and finally a wider working frequency band of the wave absorbing device is realized. The multi-layer wave absorber structure provided by the present disclosure has higher universality and operability, and has an effect of significantly improving an effective absorption bandwidth for wave absorbing devices made of various composite wave absorbing materials. In addition, when the air or vacuum interlayer is selected, the effective absorption bandwidth can be obviously improved while a mass is hardly increased, such that the multi-layer wave absorber structure provided by the present disclosure has higher application value.

The technical solutions in the present disclosure are clearly and completely described below in conjunction with examples of the present disclosure. It is clear that the described examples are merely a part, rather than all of the examples of the present disclosure. All other examples obtained by those of ordinary skill in the art based on the examples of the present disclosure without creative efforts shall fall within the protection scope of the present disclosure.

Example 1

(1) Single-layer graphene wave absorber: a metal backing and a graphene-paraffin composite wave absorbing material on a surface of the metal backing.

Figure 4A:
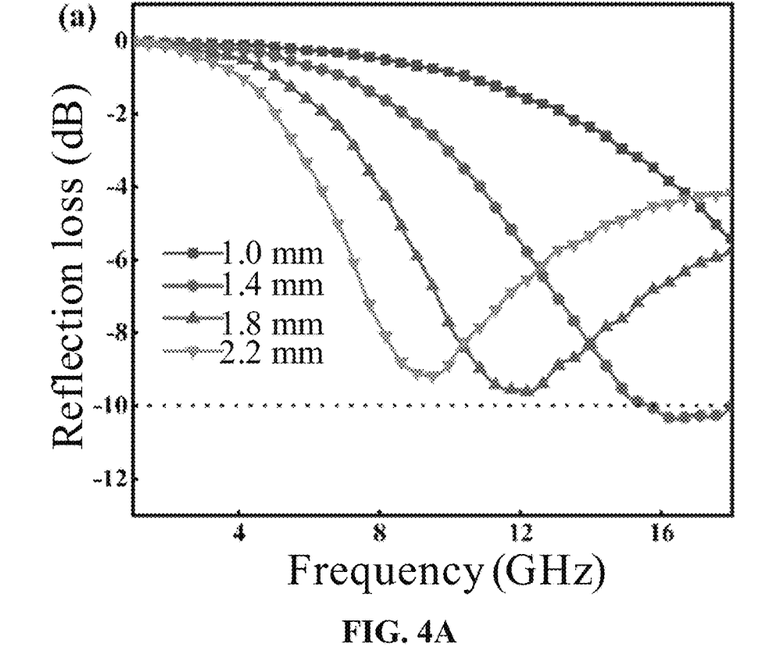
FIG. 4A shows theoretical reflection loss curves of a single-layer graphene wave absorber.

Paraffin was dissolved in n-hexane, added with graphene powder, and centrifuged and stirred until the n-hexane volatilized to obtain the uniformly mixed graphene-paraffin composite wave absorbing material (the graphene and the paraffin had a mass ratio of 3:8). The graphene-paraffin composite wave absorbing material was placed in a mold and pressed to obtain a cylindrical ring with an inner diameter of 3.04 mm and an outer diameter of 7.00 mm. Electromagnetic parameters of the cylindrical ring were measured on an Agilent vector network analyzer. According to the electromagnetic parameters, electromagnetic wave reflection loss curves of cylindrical rings with different thicknesses were calculated. The results are shown in FIG. 4A. It can be seen from FIG. 4A that the single-layer graphene wave absorber has an optimal effective absorption bandwidth of 2.38 GHz, and a coverage frequency band of 15.62-18 GHz.

Figure 4B:
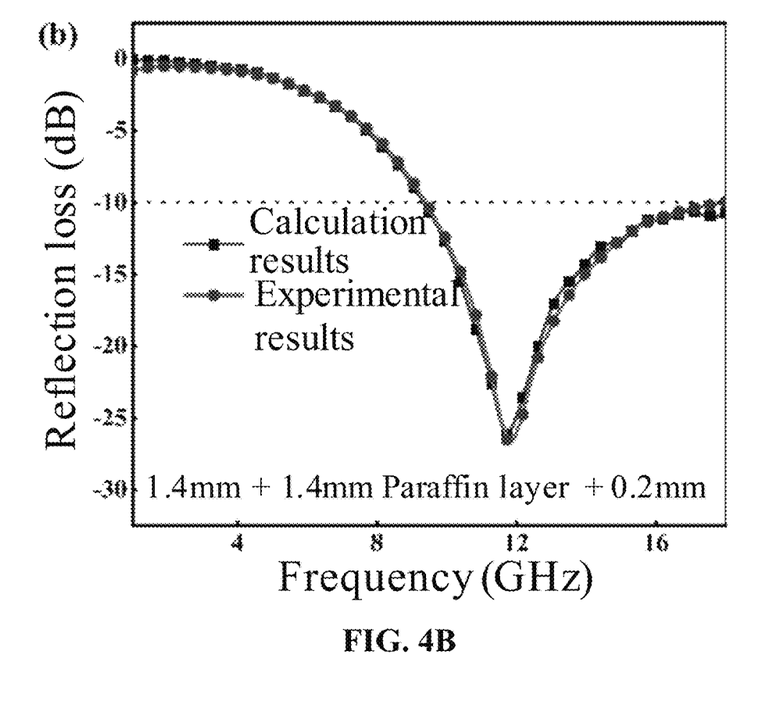
FIG. 4B shows a theoretically calculated reflection loss curve and an experimentally tested reflection loss curve of a multi-layer wave absorber structure obtained after a paraffin interlayer is added through improvement of the present disclosure.

(2) A paraffin layer with a thickness of 1.4 mm was added to the single-layer graphene wave absorber as an electromagnetic loss-free dielectric layer, and the obtained multi-layer wave absorber was: the metal backing and a 1.4 mm graphene-paraffin composite wave absorbing material layer, a 1.4 mm paraffin layer, and a 0.2 mm graphene-paraffin composite wave absorbing material layer (recorded as 1.4 mm+1.4 mm paraffin layer+0.2 mm) that were sequentially stacked on a surface of the metal backing. According to the method of step (1), a theoretically calculated reflection loss curve of the multi-layer wave absorber structure was obtained, as shown in FIG. 4B. It can be seen from FIG. 4B that the optimal effective absorption bandwidth is 8.67 GHz, and the coverage frequency band is 9.33-18 GHz.

(3) The multi-layer wave absorber structure in step (2) was prepared, and its reflection loss curve and effective absorption bandwidth were tested. The experimental test results are shown in FIG. 4B. It can be seen from FIG. 4B that the experimental test results of the multi-layer wave absorber structure are highly consistent with the results predicted by the program. It is shown that the present disclosure successfully increases the effective absorption bandwidth of the graphene-paraffin composite wave absorbing material from 2.38 GHz to 8.67 GHz with an increase of 264%.

Example 2

Figure 5:
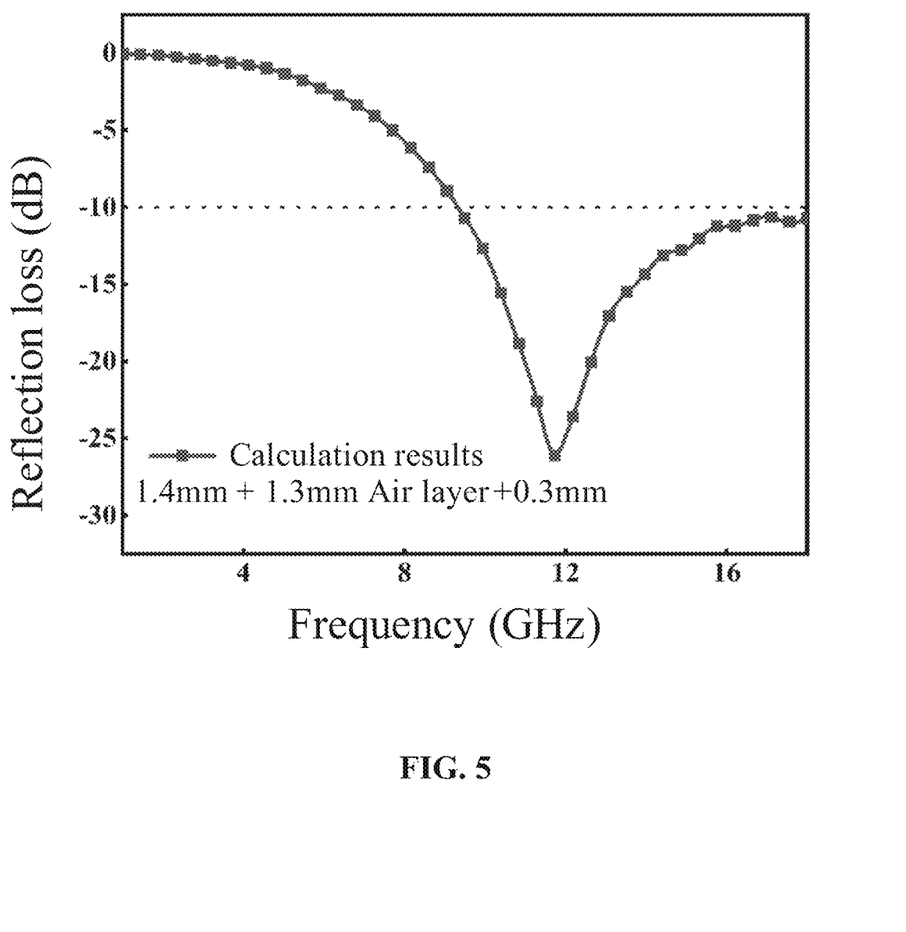
FIG. 5 shows a theoretical reflection loss curve of a multi-layer wave absorber obtained after an air interlayer is added through improvement of the present disclosure in Example 2.

According to the method of steps (1) to (2) of Example 1, the theoretical calculation of the reflection loss curve of the multi-layer wave absorber structure was carried out. The difference from Example 1 was that the electromagnetic loss-free dielectric layer in step (2) was an air layer with a thickness of 1.3 mm, and the multi-layer wave absorber structure was a metal backing and a 1.4 mm graphene-paraffin composite wave absorbing material layer, a 1.3 mm air layer, and a 0.3 mm graphene-paraffin composite wave absorbing material layer (recorded as 1.4 mm+1.3 mm air layer+0.3 mm) that were sequentially stacked on a surface of the metal backing. The theoretically calculated reflection loss curve is shown in FIG. 5. Limited to the laboratory, there is currently no way to prepare hollow samples for testing. There is little difference between the calculation results and the use of paraffin as the electromagnetic loss-free dielectric layer, because air and paraffin have similar high-frequency electromagnetic properties, both of which have almost no electromagnetic loss and were non-magnetic, and the difference is only that the air has a permittivity of 1 and the paraffin has a permittivity of about 2.28. If hollow structures are finally technically possible, the effective absorption bandwidth can be greatly improved with little increase in the total mass.

Example 3

(1) Paraffin was dissolved in n-hexane, added with $La_2Fe_4Co_{10}B$ powder, and centrifuged and stirred until the n-hexane volatilized to obtain a uniformly mixed $La_2Fe_4Co_{10}B$-paraffin composite wave absorbing material (the $La_2Fe_4Co_{10}B$ and the paraffin had a mass ratio of 5:1). The $La_2Fe_4Co_{10}B$-paraffin composite wave absorbing material was placed in a mold and pressed to obtain a $La_2Fe_4Co_{10}B$-paraffin cylindrical ring (recorded as single-layer $La_2Fe_4Co_{10}B$) with an inner diameter of 3.04 mm and an outer diameter of 7.00 mm.

(2) The $La_2Fe_4Co_{10}B$ in step (1) was replaced with carbonyl iron, and the carbonyl iron and the paraffin had a mass ratio of 3:1 to obtain a carbonyl iron-paraffin cylindrical ring (recorded as single-layer carbonyl iron).

(3) An $La_2Fe_4Co_{10}B$/carbonyl iron double-layer wave absorber (recorded as double-layer): a metal backing and a 0.9 mm $La_2Fe_4Co_{10}B$-paraffin composite wave absorbing material layer and a 0.7 mm carbonyl iron-paraffin composite wave absorbing material layer that were sequentially stacked on a surface of the metal backing.

Figure 6A:
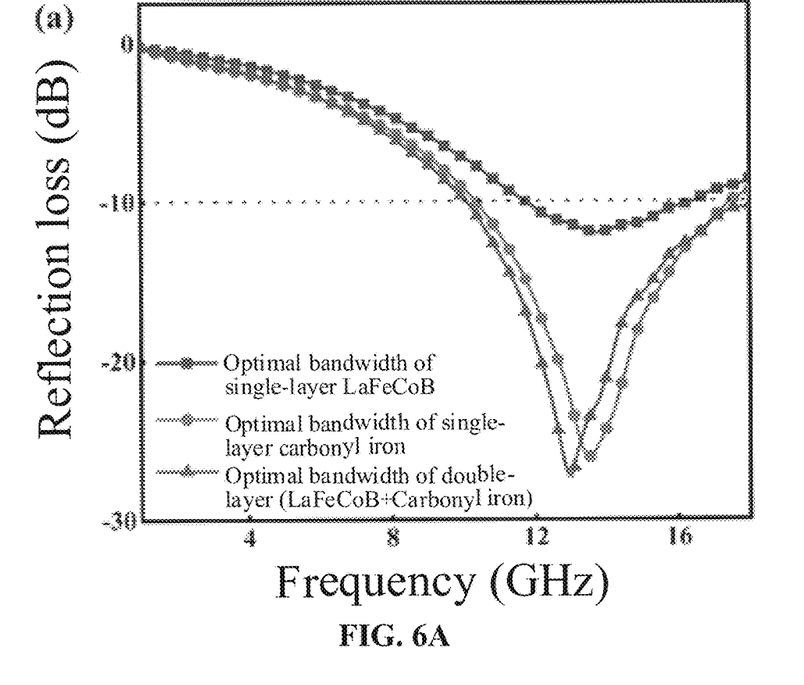
FIG. 6A shows theoretical reflection loss curves of a single-layer $La_2Fe_4Co_{10}B$ wave absorber, a single-layer carbonyl iron wave absorber, and a $La_2Fe_4Co_{10}B$/carbonyl iron double-layer wave absorber.

(4) Electromagnetic parameters of the cylindrical ring in steps (1) to (3) were measured on an Agilent vector network analyzer. According to the electromagnetic parameters, electromagnetic wave reflection loss curves of different thicknesses were calculated. The results are shown in FIG. 6A. It can be seen from FIG. 6A that the single-layer $La_2Fe_4Co_{10}B$ has an optimal effective absorption bandwidth of 4.7 GHz, the single-layer carbonyl iron has an optimal effective absorption bandwidth of 7.1 GHz, and the $La_2Fe_4Co_{10}B$/carbonyl iron double-layer wave absorber has an optimal effective absorption bandwidth of 7.9 GHz, and a coverage frequency band of 10.1-18 GHz, which exceeds the optimal effective absorption bandwidths of the single-layer wave absorbers composed of these two composite wave absorbing materials.

Figure 6B:
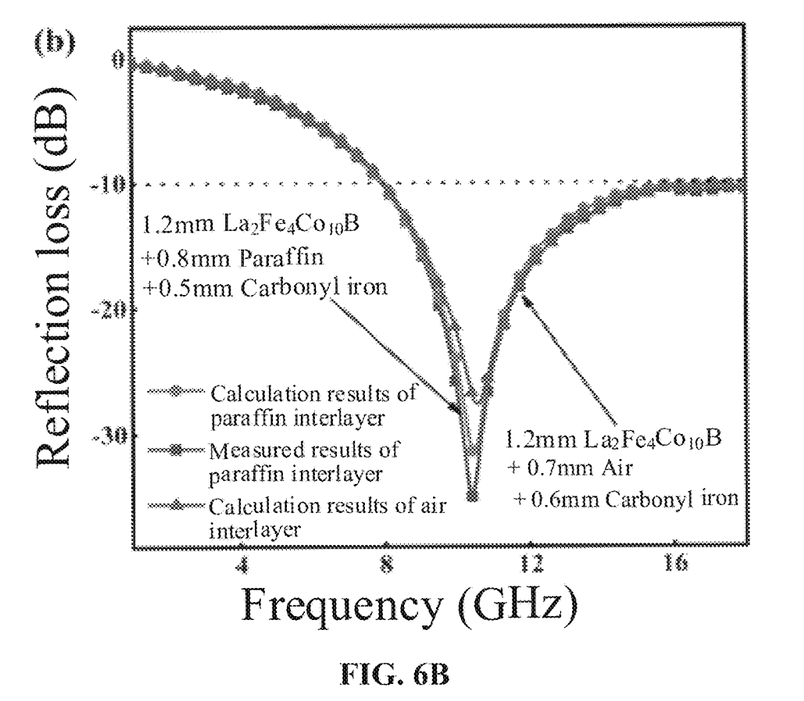
FIG. 6B shows theoretically calculated reflection loss curves and an experimentally tested reflection loss curve of a multi-layer wave absorber structure obtained after an air interlayer and a paraffin interlayer are added through improvement of the present disclosure.

(5) The multi-layer wave absorber: a metal backing and a 1.2 mm $La_2Fe_4Co_{10}B$-paraffin composite wave absorbing material layer, a 0.8 mm paraffin layer, and a 0.5 mm carbonyl iron-paraffin composite wave absorbing material layer (recorded as 1.2 mm $La_2Fe_4Co_{10}B$+0.8 mm paraffin+ 0.5 mm carbonyl iron) that were sequentially stacked on a surface of the metal backing, or a 1.2 mm $La_2Fe_4Co_{10}B$-paraffin composite wave absorbing material layer, a 0.7 mm air layer, and a 0.6 mm carbonyl iron-paraffin composite wave absorbing material layer (recorded as 1.2 mm $La_2Fe_4Co_{10}B$+0.7 mm air+0.6 mm carbonyl iron) that were sequentially stacked on a surface of the metal backing. According to the method of step (1), a theoretically calculated reflection loss curve of the multi-layer wave absorber structure was obtained, as shown in FIG. 6B. It can be seen from FIG. 6B that the optimal effective absorption bandwidth of the multi-layer wave absorber structure after the paraffin interlayer is added reaches 10 GHz, and the optimal effective absorption bandwidth of the multi-layer wave absorber structure after the air interlayer is added reaches 10 GHz.

(6) The reflection loss curve and effective absorption bandwidth of the multi-layer wave absorber structure after the paraffin interlayer is added in step (5) were tested. The experimental test results are shown in FIG. 6B. It can be seen from FIG. 6B that the experimental test results of the multi-layer wave absorber structure are highly consistent with the results predicted by the program. It is shown that the present disclosure successfully increases the effective absorption bandwidth of the $La_2Fe_4Co_{10}B$/carbonyl iron double-layer wave absorber from 7.9 GHz to 10 GHz with an increase of 27%.

It can be seen from Examples 1 to 3 that the preparation method provided by the present disclosure can not only be used to optimize a single-layer wave absorbing material composed of a single material, but also be used to optimize a double-layer wave absorbing material composed of different materials. Moreover, it is verified that the theoretical calculation results are highly consistent with the experimental test results.

Example 4

Figure 7A:
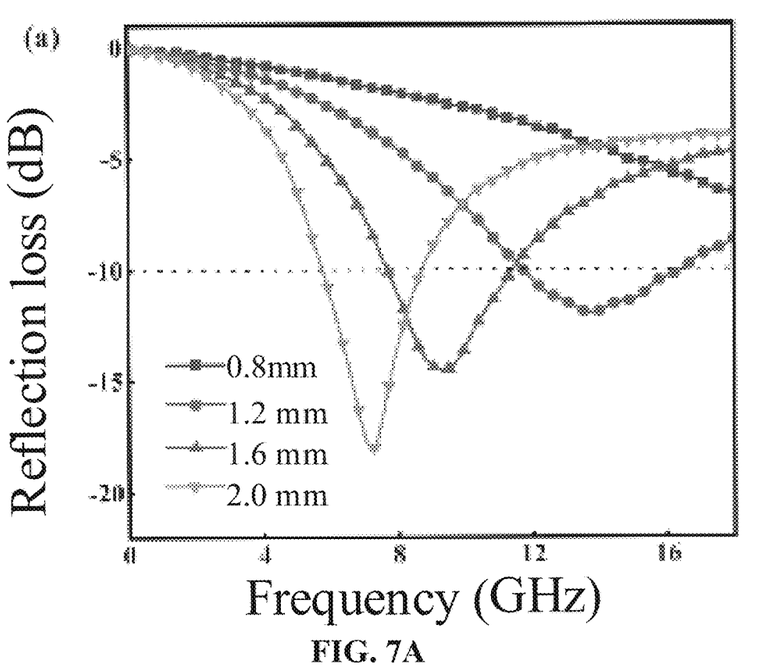
FIG. 7A shows theoretical reflection loss curves of a single-layer $La_2Fe_4Co_{10}B$ wave absorber.

(1) Paraffin was dissolved in n-hexane, added with $La_2Fe_4Co_{10}B$ powder, and centrifuged and stirred until the n-hexane volatilized to obtain a uniformly mixed $La_2Fe_4Co_{10}B$-paraffin composite wave absorbing material (the $La_2Fe_4Co_{10}B$ and the paraffin had a mass ratio of 5:1). The $La_2Fe_4Co_{10}B$-paraffin composite wave absorbing material was placed in a mold and pressed to obtain a $La_2Fe_4Co_{10}B$-paraffin cylindrical ring (recorded as single-layer $La_2Fe_4Co_{10}B$) with an inner diameter of 3.04 mm and an outer diameter of 7.00 mm. Electromagnetic parameters of the cylindrical ring were measured on an Agilent vector network analyzer. According to the electromagnetic parameters, electromagnetic wave reflection loss curves of different thicknesses were calculated. The results are shown in FIG. 7A. It can be seen from FIG. 7A that the $La_2Fe_4Co_{10}B$-paraffin has an optimal effective absorption bandwidth of 4.7 GHz, and a coverage frequency band of 11.7-16.4 GHz.

Figure 7B:
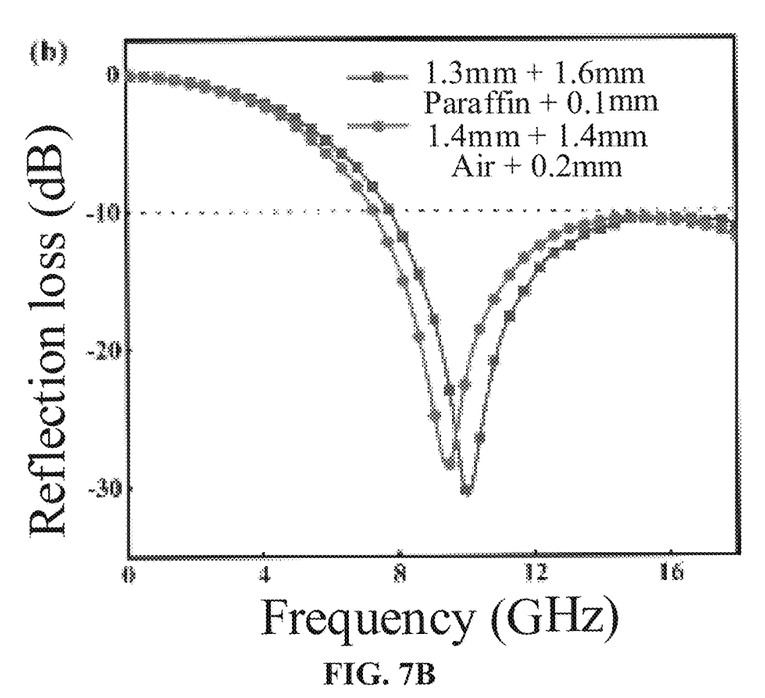
FIG. 7B shows theoretically calculated reflection loss curves of a multi-layer wave absorber structure obtained after an air interlayer and a paraffin interlayer are added through improvement of the present disclosure.

(2) A paraffin layer with a thickness of 1.6 mm or an air layer with a thickness of 1.4 mm was added to the single-layer $La_2Fe_4Co_{10}B$ as an electromagnetic loss-free dielectric layer, and the obtained multi-layer wave absorber was: a metal backing and a 1.3 mm $La_2Fe_4Co_{10}B$-paraffin composite wave absorbing material layer, a 1.6 mm paraffin layer, and a 0.1 mm $La_2Fe_4Co_{10}B$-paraffin composite wave absorbing material layer (recorded as 1.3 mm+1.6 mm paraffin+0.1 mm) that were sequentially stacked on a surface of the metal backing, or a 1.4 mm $La_2Fe_4Co_{10}B$-paraffin composite wave absorbing material layer, a 1.4 mm air layer, and a 0.2 mm $La_2Fe_4Co_{10}B$-paraffin composite wave absorbing material layer (recorded as 1.4 mm+1.4 mm air+0.2 mm) that were sequentially stacked on a surface of the metal backing. According to the method of step (1), a theoretically calculated reflection loss curve of the multi-layer wave absorber structure was obtained, as shown in FIG. 7B. It can be seen from FIG. 7B that the optimal effective absorption bandwidth of the multi-layer wave absorber structure after the paraffin interlayer is added reaches 10.25 GHz, and a coverage frequency band is 7.75-18 GHz, and the optimal effective absorption bandwidth of the multi-layer wave absorber structure after the air interlayer is added reaches 10.72 GHz, and a coverage frequency band is 7.28-18 GHz. It is shown that the present disclosure successfully increases the effective absorption bandwidth of the single-layer $La_2Fe_4Co_{10}B$ wave absorber from 4.7 GHz to 10.72 GHz with an increase of 128%.

Example 5

(1) Paraffin was dissolved in n-hexane, added with $Ce_{1.75}Sm_{0.25}Fe_{17}N_{3-\delta}$ powder, and centrifuged and stirred until the n-hexane volatilized to obtain a uniformly mixed $Ce_{1.75}Sm_{0.25}Fe_{17}N_{3-\delta}$-paraffin composite wave absorbing material. The $Ce_{1.75}Sm_{0.25}Fe_{17}N_{3-\delta}$-paraffin composite wave absorbing material was placed in a mold and pressed to obtain a $Ce_{1.75}Sm_{0.25}Fe_{17}N_{3-\delta}$-paraffin cylindrical ring (recorded as single-layer $Ce_{1.75}Sm_{0.25}Fe_{17}N_{3-\delta}$) with an inner diameter of 3.04 mm and an outer diameter of 7.00 mm. The $Ce_{1.75}Sm_{0.25}Fe_{17}N_{3-\delta}$ and the paraffin had a mass ratio of 4:1.

(2) The $Ce_{1.75}Sm_{0.25}Fe_{17}N_{3-\delta}$ in step (1) was replaced with ferrite, and the ferrite and the paraffin had a mass ratio of 4:1 to obtain a ferrite-paraffin cylindrical ring (recorded as single-layer ferrite).

(3) A $Ce_{1.75}Sm_{0.25}Fe_{17}N_{3-\delta}$ ferrite double-layer wave absorber (recorded as double-layer): a metal backing and an $La_2Fe_4Co_{10}B$-paraffin composite wave absorbing material layer and a ferrite-paraffin composite wave absorbing material layer that were sequentially stacked on a surface of the metal backing (recorded as double-layer), with a thickness of 2-3 mm.

Figure 8A:
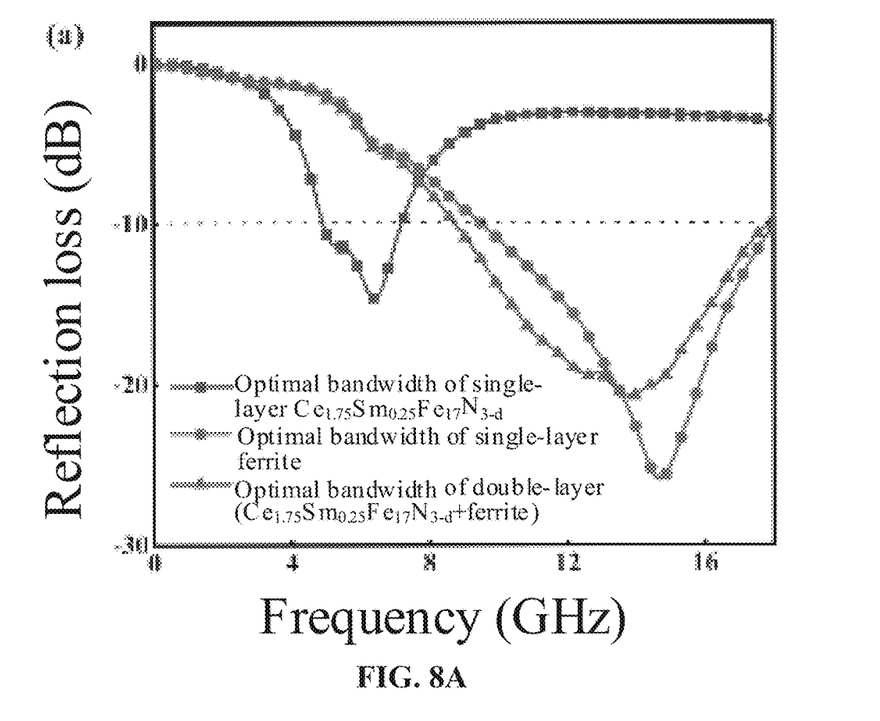
FIG. 8A shows theoretical reflection loss curves of a single-layer $Ce_{1.75}Sm_{0.25}Fe_{17}N_{3-\delta}$ wave absorber, a single-layer ferrite wave absorber, and a $Ce_{1.75}Sm_{0.25}Fe_{17}N_{3-\delta}$/ferrite double-layer wave absorber.

(4) Electromagnetic parameters of the cylindrical ring wave absorber in steps (1) to (3) were measured on an Agilent vector network analyzer. According to the electromagnetic parameters, electromagnetic wave reflection loss curves of different thicknesses were calculated. The results are shown in FIG. 8A. It can be seen from FIG. 8A that the single-layer $Ce_{1.75}Sm_{0.25}Fe_{17}N_{3-\delta}$ has an optimal effective absorption bandwidth of 2.29 GHz, the single-layer ferrite has an optimal effective absorption bandwidth of 8.48 GHz, and the double-layer wave absorbing material has an optimal effective absorption bandwidth of 9.12 GHz, and a coverage frequency band of 8.74-17.86 GHz, which exceeds the optimal effective absorption bandwidths of the single-layer wave absorbing materials composed of these two composite absorbing materials.

Figure 8B:
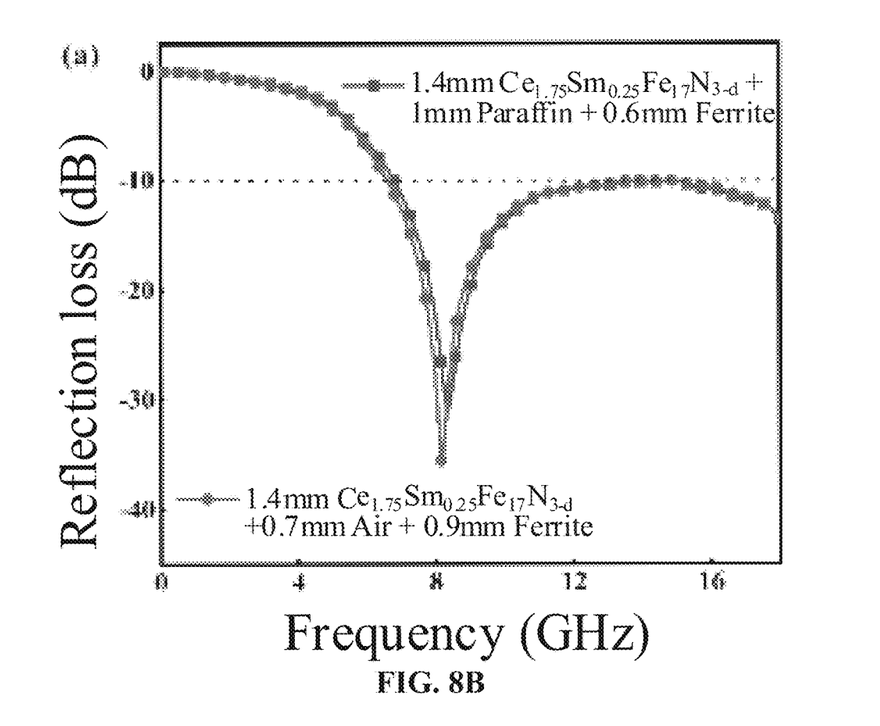
FIG. 8B shows theoretically calculated reflection loss curves of a multi-layer wave absorber structure obtained after an air interlayer and a paraffin interlayer are added through improvement of the present disclosure.

(5) A paraffin layer with a thickness of 1 mm or an air layer with a thickness of 0.7 mm was added to the $Ce_{1.75}Sm_{0.25}Fe_{17}N_{3-\delta}$/ferrite double-layer wave absorber as an electromagnetic loss-free dielectric layer, and the obtained multi-layer wave absorber structure was: a metal backing and a 1.4 mm $Ce_{1.75}Sm_{0.25}Fe_{16}N_{3-\delta}$-paraffin composite wave absorbing material layer, a 1 mm paraffin layer, and a 0.1 mm ferrite-paraffin composite wave absorbing material layer (recorded as 1.4 mm $Ce_{1.75}Sm_{0.25}Fe_{17}N_{3-\delta}$+1 mm paraffin+0.6 mm ferrite) that were sequentially stacked on a surface of the metal backing, or a 1.4 mm $Ce_{1.75}Sm_{0.25}Fe_{17}N_{3-\delta}$-paraffin composite wave absorbing material layer, a 0.7 mm air layer, and a 0.9 mm ferrite-paraffin composite wave absorbing material layer (recorded as 1.4 mm+0.7 mm air+0.9 mm ferrite) that were sequentially stacked on a surface of the metal backing. According to the method of step (1), a theoretical reflection loss curve of the two multi-layer wave absorber structures was obtained, as shown in FIG. 8B. It can be seen from FIG. 8B that the optimal effective absorption bandwidth of the multi-layer wave absorber structure after the paraffin interlayer is added reaches 11.2 GHz, and a coverage frequency band is 6.8-18 GHz, and the optimal effective absorption bandwidth of the multi-layer wave absorber structure after the air interlayer is added reaches 11.4 GHz, and a coverage frequency band is 6.6-18 GHz. It is shown that the present disclosure successfully increases the effective absorption bandwidth of the $Ce_{1.75}Sm_{0.25}Fe_{17}N_{3-\delta}$/ferrite double-layer wave absorber from 9.12 GHz to 11.4 GHz with an increase of 25%.

Example 6

(1) Paraffin was dissolved in n-hexane, added with $Ce_{1.75}Sm_{0.25}Fe_{17}N_{3-\delta}$ powder, and centrifuged and stirred until the n-hexane volatilized to obtain a uniformly mixed $Ce_{1.75}Sm_{0.25}Fe_{17}N_{3-\delta}$-paraffin composite wave absorbing material. The $Ce_{1.75}Sm_{0.25}Fe_{17}N_{3-\delta}$-paraffin composite wave absorbing material was placed in a mold and pressed to obtain a $Ce_{1.75}Sm_{0.25}Fe_{17}N_{3-\delta}$-paraffin cylindrical ring (recorded as single-layer $Ce_{1.75}Sm_{0.25}Fe_{17}N_{3-\delta}$) with an inner diameter of 3.04 mm and an outer diameter of 7.00 mm. The $Ce_{1.75}Sm_{0.25}Fe_{17}N_{3-\delta}$ and the paraffin had a mass ratio of 4:1.

(2) The $Ce_{1.75}Sm_{0.25}Fe_{17}N_{3-\delta}$ in step (1) was replaced with carbonyl iron, and the carbonyl iron and the paraffin had a mass ratio of 3:1 to obtain a carbonyl iron-paraffin cylindrical ring (recorded as single-layer carbonyl iron).

(3) A $Ce_{1.75}Sm_{0.25}Fe_{17}N_{3-\delta}$/carbonyl iron double-layer wave absorber (recorded as double-layer): a metal backing and an $La_2Fe_4Co_{10}B$-paraffin composite wave absorbing material layer and a carbonyl iron-paraffin composite wave absorbing material that were sequentially stacked on a surface of the metal backing, with a thickness of 2-3 mm.

Figure 9A:
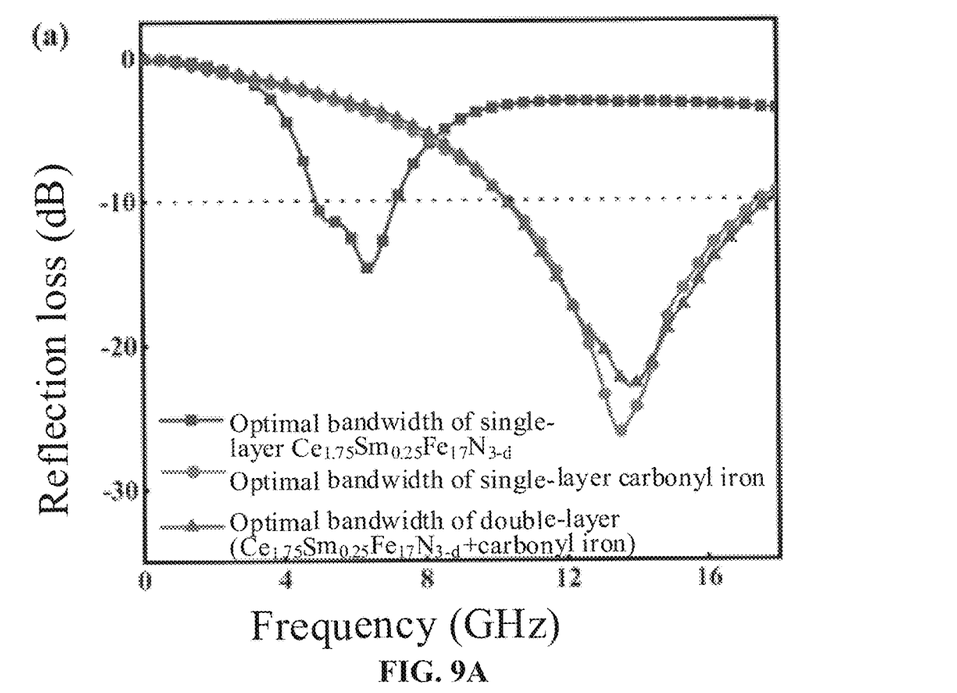
FIG. 9A shows theoretical reflection loss curves of a single-layer $Ce_{1.75}Sm_{0.25}Fe_{17}N_{3-\delta}$ wave absorber, a single-layer carbonyl iron wave absorber, and a $Ce_{1.75}Sm_{0.25}Fe_{17}N_{3-\delta}$/carbonyl iron double-layer wave absorber.

(4) Electromagnetic parameters of the wave absorber in steps (1) to (3) were measured on an Agilent vector network analyzer. According to the electromagnetic parameters, electromagnetic wave reflection loss curves of different thicknesses were calculated. The results are shown in FIG. 9A. It can be seen from FIG. 9A that the single-layer $Ce_{1.75}Sm_{0.25}Fe_{17}N_{3-\delta}$ has an optimal effective absorption bandwidth of 2.29 GHz, the single-layer carbonyl iron has an optimal effective absorption bandwidth of 7.13 GHz, and the double-layer wave absorbing material has an optimal effective absorption bandwidth of 7.6 GHz, and a coverage frequency band of 10.29-17.89 GHz, which exceeds the optimal effective absorption bandwidths of the single-layer wave absorbing materials composed of these two composite absorbing materials.

Figure 9B:
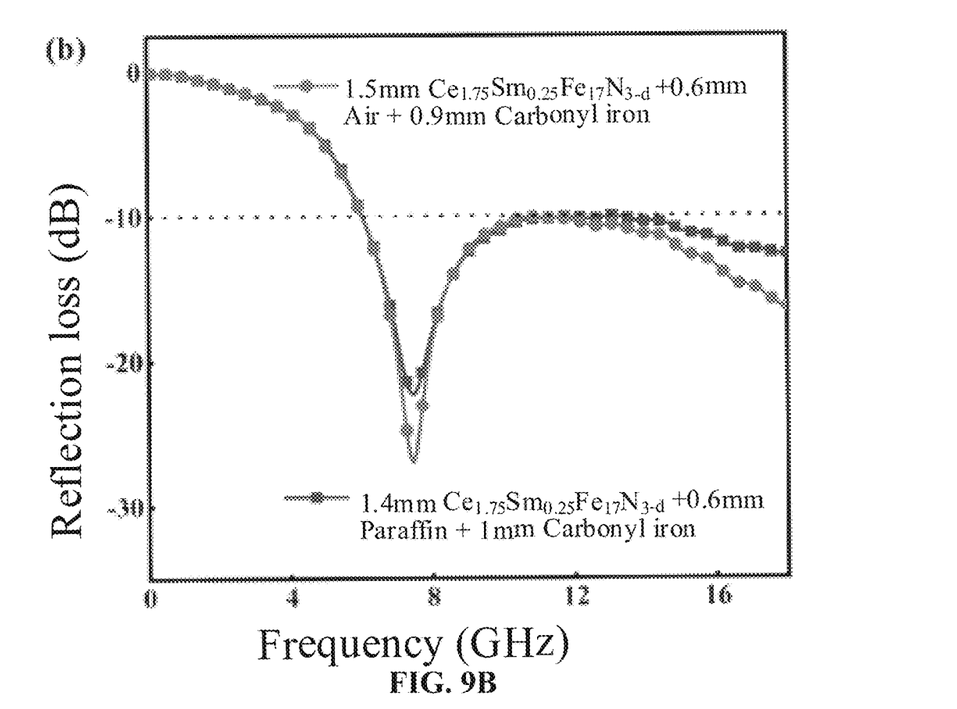
FIG. 9B shows theoretically calculated reflection loss curves of a multi-layer wave absorber structure obtained after an air interlayer and a paraffin interlayer are added through improvement of the present disclosure.

(5) A paraffin layer with a thickness of 0.6 mm or an air layer with a thickness of 0.6 mm was added to the $Ce_{1.75}Sm_{0.25}Fe_{17}N_{3-\delta}$/carbonyl iron double-layer wave absorber as an electromagnetic loss-free dielectric layer, and the obtained multi-layer wave absorber structure was: a metal backing and a 1.4 mm $Ce_{1.75}Sm_{0.25}Fe_{17}N_{3-\delta}$-paraffin composite wave absorbing material layer, a 0.6 mm paraffin layer, and a 1 mm carbonyl iron-paraffin composite wave absorbing material layer (recorded as 1.4 mm $Ce_{1.75}Sm_{0.25}Fe_{17}N_{3-\delta}$+0.6 mm paraffin +1 mm carbonyl iron) that were sequentially stacked on a surface of the metal backing, or a 1.5 mm $Ce_{1.75}Sm_{0.25}Fe_{17}N_{3-\delta}$-paraffin composite wave absorbing material layer, a 0.6 mm air layer, and a 0.9 mm carbonyl iron-paraffin composite wave absorbing material layer (recorded as 1.5 mm+0.6 mm air+0.9 mm carbonyl iron) that were sequentially stacked on a surface of the metal backing. According to the method of step (1), a theoretically calculated reflection loss curve of the multi-layer wave absorber structure was obtained, as shown in FIG. 9B. It can be seen from FIG. 9B that the optimal effective absorption bandwidth of the multi-layer wave absorber structure after the paraffin interlayer is added reaches 11.96 GHz, and a coverage frequency band is 6.04-18 GHz, and the optimal effective absorption bandwidth of the multi-layer wave absorber structure after the air interlayer is added reaches 12 GHz, and a coverage frequency band is 6-18 GHz. It is shown that the present disclosure successfully increases the effective absorption bandwidths of the double-layer wave absorbing materials composed of the two composite wave absorbing materials, the $Ce_{1.75}Sm_{0.25}Fe_{17}N_{3-\delta}$-paraffin and the carbonyl iron-paraffin, from 7.6 GHz to 12 GHz with an increase of 58%.

The above descriptions are merely preferred implementations of the present disclosure. It should be noted that those of ordinary skill in the art may further make several improvements and modifications without departing from the principle of the present disclosure, but such improvements and modifications should be deemed as falling within the protection scope of the present disclosure.

What is claimed is:

1. A multi-layer wave absorber structure, having a sandwich structure, wherein an intermediate layer of the sandwich structure is an electromagnetic loss-free dielectric layer;
the multi-layer wave absorber structure comprising a metal backing, a first composite wave absorbing material layer, the electromagnetic loss-free dielectric layer, and a second composite wave absorbing material layer that are sequentially stacked on a surface of the metal backing;
wherein the electromagnetic loss-free dielectric layer comprises a vacuum layer, an air layer, or an electromagnetic loss-free material layer, wherein the electromagnetic loss-free material layer is made of one or more materials selected from the group consisting of paraffin and polytetrafluoroethylene;
wherein the first composite wave absorbing material layer and the second composite wave absorbing material layer each comprise an electromagnetic wave absorbing agent and a binder, and a mass ratio of the electromagnetic wave absorbing agent to the binder is in a range of 0.1-10:1;
wherein the electromagnetic wave absorbing agent is at least one selected from the group consisting of graphene, carbonyl iron, ferrite, and rare earth-transition intermetallic compounds;
wherein the first composite wave absorbing material layer and the second composite wave absorbing material layer each independently have a thickness of 0.1-2 mm; and
wherein the multi-layer wave absorber structure has a thickness of less than or equal to 3 mm.

2. The multi-layer wave absorber structure according to claim 1, wherein the rare earth-transition intermetallic compounds comprise $La_2Fe_4Co_{10}B$ and/or $Ce_{1.75}Sm_{0.25}Fe_{17}N_{3-\delta}$.

3. A method of using the multi-layer wave absorber structure according to claim 1, comprising using the multi-layer wave absorber structure to provide microwave absorption.

4. The method according to claim 3, wherein the rare earth-transition intermetallic compounds comprise $La_2Fe_4Co_{10}B$ and/or $Ce_{1.75}Sm_{0.25}Fe_{17}N_{3-\delta}$.

5. The multi-layer wave absorber structure according to claim 1, wherein the multi-layer wave absorber structure has a thickness of 2-3 mm.

6. The multi-layer wave absorber structure according to claim 1, wherein the first composite wave absorbing material layer and the second composite wave absorbing material layer each independently have a thickness of 0.5-2 mm.

7. The multi-layer wave absorber structure according to claim 1, wherein the first composite wave absorbing material layer and the second composite wave absorbing material layer each independently have a thickness of 1-1.5 mm.

* * * * *